United States Patent
Song et al.

(10) Patent No.: US 9,989,561 B2
(45) Date of Patent: Jun. 5, 2018

(54) VOLTAGE MEASUREMENT DEVICE AND VOLTAGE SENSOR

(71) Applicant: SAMSUNG ELECTRONICS CO., LTD., Suwon-si, Gyeonggi-do (KR)

(72) Inventors: Seung-hyun Song, Seoul (KR); Hui-gyeong Ahn, Suwon-si (KR); Sang-tae Han, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 167 days.

(21) Appl. No.: 14/851,017

(22) Filed: Sep. 11, 2015

(65) Prior Publication Data

US 2016/0154025 A1   Jun. 2, 2016

(30) Foreign Application Priority Data

Dec. 1, 2014 (KR) .................... 10-2014-0169824

(51) Int. Cl.
  *G01R 1/20* (2006.01)
  *G01R 15/16* (2006.01)
  *G01R 15/18* (2006.01)
  *G01R 19/00* (2006.01)
  *G01R 21/06* (2006.01)

(52) U.S. Cl.
  CPC ............ *G01R 15/16* (2013.01); *G01R 15/18* (2013.01); *G01R 19/0084* (2013.01); *G01R 21/06* (2013.01)

(58) Field of Classification Search
  None
  See application file for complete search history.

(56) References Cited

U.S. PATENT DOCUMENTS

| | | | | |
|---|---|---|---|---|
| 4,090,130 A | * | 5/1978 | Willenbecher, Jr. | F02P 17/12 324/126 |
| 5,473,244 A | * | 12/1995 | Libove | G01R 1/22 324/126 |
| 5,949,230 A | * | 9/1999 | Kobayashi | G01R 1/07 324/544 |
| 6,825,649 B2 | | 11/2004 | Nakano | |
| 9,007,077 B2 | * | 4/2015 | El-Essawy | G01R 15/205 324/117 H |
| 2002/0171433 A1 | * | 11/2002 | Watanabe | G01R 15/16 324/539 |

(Continued)

FOREIGN PATENT DOCUMENTS

| | | |
|---|---|---|
| JP | 2003-28900 | 1/2003 |
| JP | 2003-98194 | 4/2003 |

(Continued)

*Primary Examiner* — Patrick Assouad
*Assistant Examiner* — Demetrius Pretlow
(74) *Attorney, Agent, or Firm* — Staas & Halsey

(57) ABSTRACT

A voltage measurement device is provided. The voltage measurement device includes a contact portion configured to contact an electric wire for transmitting an alternating current (AC) voltage and to output an induced voltage induced by the AC voltage in a surface of the electric wire, a capacitive element connected in series to the contact portion, and a controller configured to calculate amplitude of the AC voltage using the induced voltage output from the contact portion and a second voltage output from the capacitive element.

20 Claims, 9 Drawing Sheets

(56) References Cited

U.S. PATENT DOCUMENTS

| | | | |
|---|---|---|---|
| 2004/0183544 A1* | 9/2004 | Allan | G01R 31/11 324/533 |
| 2008/0077336 A1* | 3/2008 | Fernandes | G01R 15/142 702/57 |
| 2013/0076343 A1* | 3/2013 | Carpenter | G01R 33/02 324/202 |
| 2014/0354302 A1* | 12/2014 | Lu | G01R 19/0084 324/658 |

FOREIGN PATENT DOCUMENTS

| | | |
|---|---|---|
| JP | 2004-119384 | 4/2004 |
| JP | 4344667 | 7/2009 |

* cited by examiner (a)

(b)

(c)

(d)

(a)

(b)

VOLTAGE MEASUREMENT DEVICE AND VOLTAGE SENSOR

CROSS-REFERENCE TO RELATED APPLICATIONS

This application claims the benefit of priority under 35 U.S.C. § 119 from Korean Patent Application No. 10-2014-0169824, filed on Dec. 1, 2014, in the Korean Intellectual Property Office, the disclosure of which is incorporated herein by reference in its entirety.

BACKGROUND

1. Field

Apparatuses and methods consistent with the present disclosure relate to a voltage measurement device and a voltage sensor, and more particularly, to a voltage measurement device for calculating an alternating current (AC) voltage using a voltage induced in a surface of an electric wire with the AC voltage applied thereto and a voltage sensor for more effectively detecting a voltage induced in a surface of an electric wire.

2. Description of the Related Art

Factories with manufacturing equipment and facilities have tried to enhance power efficiency of an electricity production device used to manufacture products in order to enhance production efficiency of the products. For example, a manufacturer uses PFC power control for measuring phases of current and voltage input to a production device and matching the phases in order to enhance a power factor.

In addition, it is very important to measure and monitor current and voltage input to the production device in order to maintain the quality of a product and the reliability of the production device by indirectly detecting abnormality of a production device using the fact that power consumption is increased during an abnormal operation of the production device. And also it is worth taking into consideration recent efforts to reduce consumption power in order to reduce carbon emission quantity and to establish environmentally friendly manufacturing equipment.

Conventionally, in order to measure a voltage, it is necessary to shut off power distributed in a distribution board, strip off a wire for supplying the power to a line for producing each product, and then install a voltage measurement device connecting to the wire. In this case, it is possible to some equipments are need to keep supplying the power and there is equipment with a long restart time required after power is shut off, and thus untold losses may be caused due to idle time that occurs when the power supply is stopped. In addition, a conventional measurement method has a problem in that a significant amount of human resources and effort are necessary during an operation for connecting and installing the voltage measurement device to a wire described above.

SUMMARY

Exemplary embodiments of the present disclosure overcome the above disadvantages and other disadvantages not described above. Also, the present disclosure is not required to overcome the disadvantages described above, and an exemplary embodiment of the present disclosure may not overcome any of the problems described above.

The present disclosure provides a voltage measurement device for calculating an alternating current (AC) voltage using an induced voltage induced in a surface of an electric wire with the AC voltage applied thereto and a voltage sensor for more effectively detecting an induced voltage induced in a surface of an electric wire.

According to an aspect of the present disclosure, a voltage measurement device includes a contact portion configured to contact an electric wire for transmitting an alternating current (AC) voltage and to output an induced voltage induced by the AC voltage in a surface of the electric wire, a capacitive element connected in series to the contact portion, and a controller configured to calculate amplitude of the AC voltage using the induced voltage output from the contact portion and a second voltage output from the capacitive element.

The voltage measurement device may further include a switching unit configured to connect or disconnect the contact portion to or from the capacitive element.

The controller may control the switching unit to connect the contact portion to the capacitive element so as to receive information about the second voltage and controls the switching unit to disconnect the contact portion from the capacitive element so as to receive information about the induced voltage.

The electric wire may include a sheath for surrounding a conductive wire with the AC voltage applied thereto by an insulator with a preset thickness, and the contact portion may have capacitance with the electric wire.

The controller may calculate amplitude of the AC voltage and the capacitance formed between the electric wire and the contact portion using a first voltage value as amplitude of the induced voltage output from the contact portion, a second voltage value as amplitude of the second voltage output from the capacitive element, and capacitance of the capacitive element.

The voltage measurement device may further include a resistor configured to externally output a signal, wherein the controller performs control to sequentially apply the induced voltage and the second voltage to the resistor.

The voltage measurement device may further include a display unit configured to display amplitude of the calculated AC voltage.

The contact portion may include a first body, and a second body hinged to the first body, and when the electric wire is disposed between the first body and the second body with coupling the first body and the second body together, portions of the first and second bodies may be elastically deformed so as to closely contact an outer circumferential surface of the electric wire and to be capacitive-coupled to the electric wire.

The contact portion may restore the portions of the first and second bodies deformed to closely contact the outer circumferential surface of the electric wire to an original form when the electric wire is removed.

Each of the first body and the second body may include a shape variable members with elasticity, and a voltage induction member configured to surround the shape variable member, and the voltage measurement device may be configured in such a way that the electric wire is disposed in a gap formed by facing the voltage induction member of the first body and the second body when the first body and the second body are coupled to each other.

Each of the first body and the second body may further include a signal transfer member for externally transmitting the induced voltage induced in the voltage induction member by the capacitive coupling when an AC signal is applied to the electric wire, and the two signal transfer member may be connected to each other when the first body and the second body are coupled to each other.

Each of the first body and the second body may further include a shield member configured to shield an electromagnetic wave input from an outside, and an insulator configured to prevent contact between the signal transfer member and the shield member.

The voltage measurement device may further include a coaxial cable including an internal conductive substance connected to at least one of the two signal transfer members and an external conductive substance connected to the shield member and a ground.

The contact portion may further include a locking member configured to maintain coupling between the first body and the second body According to another aspect of the present disclosure, a voltage sensor includes a first body, and a second body hinged to the first body, wherein, when the electric wire is disposed between the first body and the second body with coupling the first body and the second body, portions of the first and second bodies are elastically deformed so as to closely contact an outer circumferential surface of the electric wire and to be capacitive-coupled to the electric wire, thereby outputting an induced voltage induced by an alternating current (AC) voltage applied to the electric wire.

According to another aspect of the present disclosure, a contact portion of a voltage sensor may include a first body, a second body coupled to the first body, and a gap disposed between the first body and the second body, the gap being configured to receive an electrical wire through which a current flows. The first body and the second body may each further include a voltage induction member having high conductivity and a shape variable member having high elasticity which is configured to make contact with an external circumference of the electrical wire, wherein the voltage induction member is configured to surround the shape variable member to thereby capacitively-couple to the electric wire when the shape variable member is in contact with the external circumference of the electrical wire.

Additional and/or other aspects and advantages of the disclosure will be set forth in part in the description which follows and, in part, will be obvious from the description, or may be learned by practice of the disclosure.

BRIEF DESCRIPTION OF THE DRAWINGS

The above and/or other aspects of the present disclosure will be more apparent by describing certain exemplary embodiments of the present disclosure with reference to the accompanying drawings, in which.

DETAILED DESCRIPTION

Reference will now be made in detail to embodiments, examples of which are illustrated in the accompanying drawings.

Figure 1:
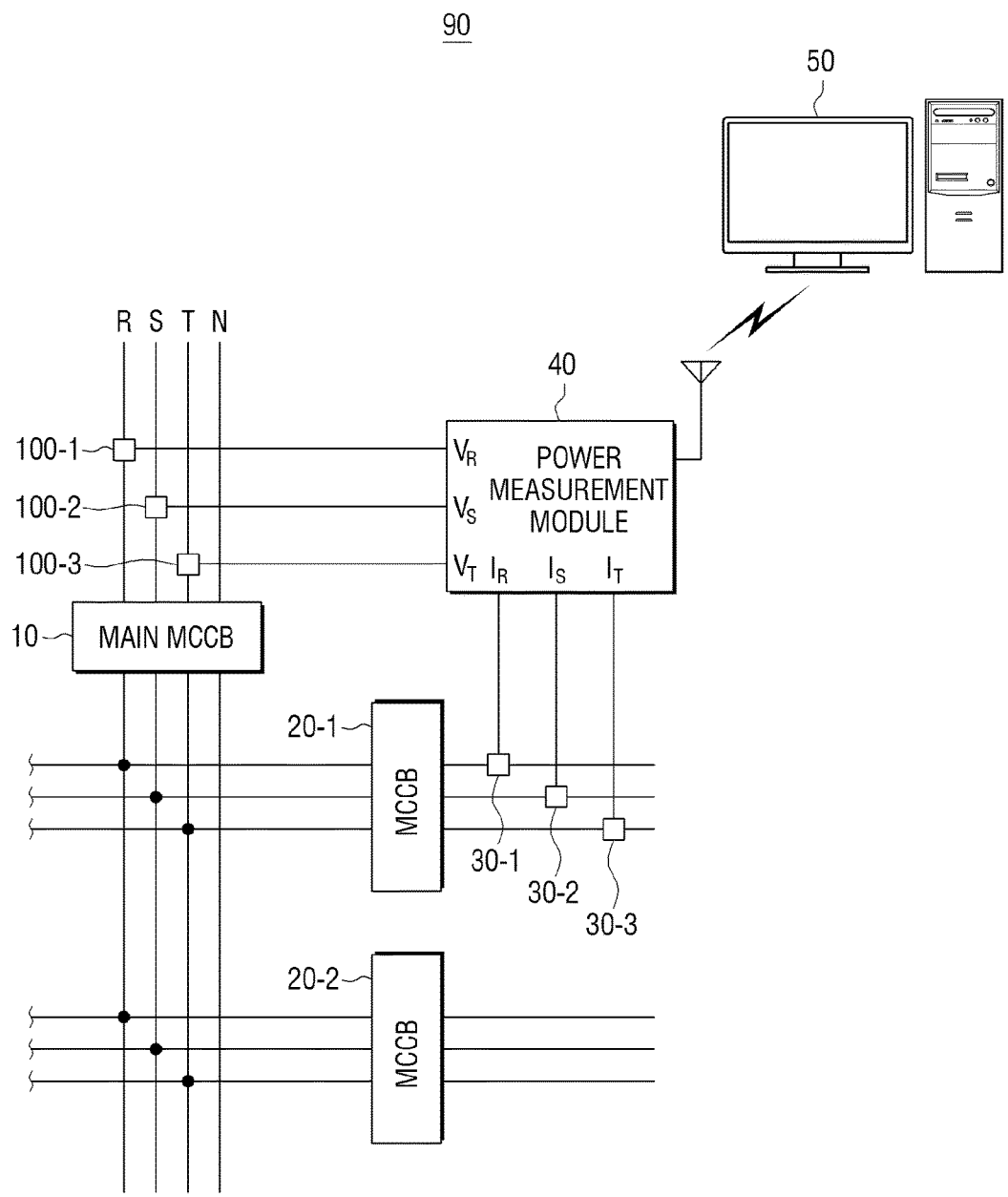
FIG. 1 is a diagram illustrating a power measurement system according to an embodiment of the present disclosure.

FIG. 1 is a diagram illustrating a power measurement system 90 according to an embodiment of the present disclosure.

Referring to FIG. 1, the power measurement system 90 includes a plurality of voltage sensors 100-1, 100-2, and 100-3, a plurality of current sensors 30-1, 30-2, and 30-3, a power measurement module 40, and a user equipment device 50 such as a computer or mobile processing device.

The plurality of voltage sensors 100-1, 100-2, and 100-3 are connected to a line for supplying power. In detail, the plurality of voltage sensors 100-1, 100-2, and 100-3 may contact and may be connected to surfaces of three cables or wires R, S, and T in order to measure a consumption voltage of a device for supplying three-phase power. In other words, the voltage sensor 100 may be set to surround sheaths or insulators of the wires and to be connected to the wires.

In addition, the plurality of connected voltage sensors 100-1, 100-2, and 100-3 output a signal of an induced voltage induced by a voltage applied along the wires.

The plurality of current sensors 30-1, 30-2, and 30-3 are connected to a line for supplying power. In detail, the plurality of current sensors 30-1, 30-2, and 30-3 may be connected to the R, S, and T wires branched from a central wiring, respectively in order to measure consumption current of a device being supplied with three-phase power. Here, a contact method of the current sensor 30 connected to the wires may be a non-contact method in which the current sensor 30 contacts a surface of the wire or a contact method in which the wire is cut and physically connected to the current sensor 30.

In addition, the plurality of connected current sensors 30-1, 30-2, and 30-3 may output a signal obtained by detecting current according to a contact method. For example, when the current sensor 30 is connected to the cable or wire in a non-contact manner, a signal is output as induced current according to a Hall effect.

The power measurement module 40 receives signals output from the plurality of voltage sensors 100-1, 100-2, and 100-3 and the plurality of current sensors 30-1, 30-2, and 30-3. In detail, the power measurement module 40 may be connected to the plurality of voltage sensors 100-1, 100-2, and 100-3 and the plurality of current sensors 30-1, 30-2, and 30-3 and each sensor may receive signals obtained by detecting voltage and current of wires for each phase.

The power measurement module 40 may convert a received analog signal into a digital signal. In detail, the power measurement module 40 may convert the analog signal received from each of the voltage sensors 100 and the current sensors 30 into a digitized data signal.

The power measurement module 40 transmits information for calculation of power based on a signal received from each of the voltage sensor 100 and the current sensor 30 to the user equipment device 50. In detail, the power measurement module 40 may convert the analog signal received from each of the voltage sensor 100 and the current sensor 30 into a digital signal and transmit information about the converted digital signal to the user equipment device 50 using a communication interface. For example, the power measurement module 40 may digitize amplitudes of each voltage and current that is calculated by root mean squaring (RMS) an alternating detection signals in each phase, and transmit the digitalized information to the user equipment device 50 using a wireless communication interface, for example, RF communication such as WiFi, Bluetooth, Zigbee, infrared communication, UHF, and VHF, which enable local area communication between user equipments. In FIG. 1, a signal may be transmitted directly to the user equipment device 50 via near range wireless communication so as to achieve convenience of installment of the power measurement module 40 and power measurement. However, in some embodiments, the signal may be transmitted via a wired/wireless communication or may be directly transmitted by wire. In addition, although FIG. 1 illustrates the structure in which the power measurement module 40 and the user equipment device 50 are separately configured, in some embodiments, one user equipment device for directly receiving a signal by each sensor may be embodied.

The user equipment device 50 calculates voltage and current applied to the wire. In detail, the user equipment device 50 may calculate amplitudes of the voltage and current applied to the wire based on information received from the power measurement module 40.

The user equipment device 50 may receive information from a plurality of power measurement modules 40 installed in order to measure consumption power of different devices.

The user equipment device 50 may provide at least one of the calculated voltage, current, power, and energy to a user. In detail, the user equipment device 50 may directly display voltage and/or current to the user through a display unit for displaying the calculated number or a waveform of AC power and may also display additional information such as power, energy, a power factor, voltage regulation, load stability, and voltage stability.

Although FIG. 1 illustrates the case in which the power measurement system 90 is installed in the vicinity of the wires for distributing power from a distribution board including circuit breakers MCCB 10 and 20 and measures power, in some embodiments, the power measurement system 90 may be installed directly on the wire input to a device for measurement of consumption power and may measure power.

The aforementioned power measurement system may more conveniently and effectively measure a voltage in a non-contact manner without necessitating that a device acting as a measurement target be powered off.

Figure 2:
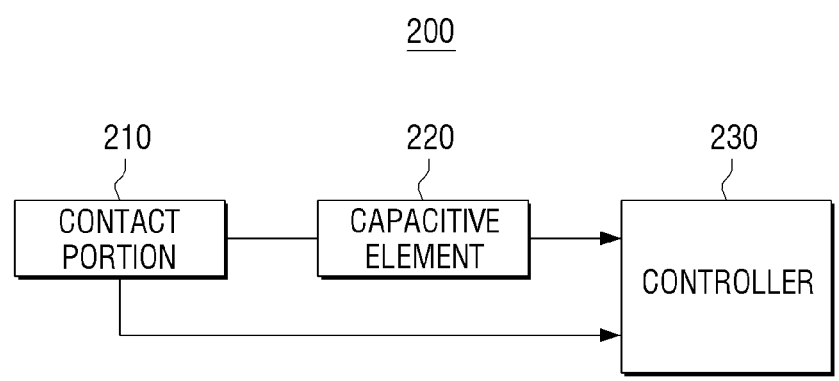
FIG. 2 is a block diagram illustrating a simple configuration of a voltage measurement device according to an embodiment of the present disclosure.

FIG. 2 is a block diagram illustrating a simple configuration of a voltage measurement device 200 according to an embodiment of the present disclosure.

Referring to FIG. 2, the voltage measurement device 200 includes a contact portion 210, a capacitive element 220, and a controller 230.

The contact portion 210 may contact a wire for transmitting an AC voltage. Here, as an example, contact with a wire may refer to contact with an external sheath for preventing power leakage and protection from damage or corrosion, instead of contact with a conductor of a wire that is mainly formed of copper or aluminum so as to transmit a power voltage. The sheath may be formed of an insulator with a preset thickness so as to surround a conductive wire along a longitudinal axis thereof.

The contact portion 210 outputs an induced voltage induced by an AC voltage on a surface of the wire for transmitting the AC voltage. In detail, the contact portion 210 that contacts a surface of the wire may be spaced apart from a conductor of the wire by a sheath of the wire surrounding the conductor and may have capacitance with the wire. Accordingly, the contact portion 210 that is capacitive-coupled to the wire may induce an induced voltage according to an AC voltage applied to the conductor of the wire. In addition, the induced voltage induced in the contact portion 210 may be output out of the contact portion 210.

The contact portion 210 may be referred to as a voltage sensor for detecting an AC voltage of the wire in that the contact portion 210 contacts the wire and outputs an induced voltage induced by the AC voltage of the wire. A detailed configuration and operation of the contact portion 210 will be described in detail with reference to FIGS. 7, 8, and 9.

The capacitive element 220 is connected in series with the contact portion 210. In detail, the capacitive element 220 may be connected in series with the contact portion 210 along a line for outputting an induced voltage induced in the contact portion 210.

Here, the capacitive element 220 may refer to an electric device with capacitance. For example, the capacitive element 220 may be an element in which an electric field is formed between spaced electrodes with different voltages to store energy, such as a capacitor.

The controller 230 controls each component of the voltage measurement device 200. In detail, the controller 230 may control functions and operations of components for measurement of a voltage. The controller may be implemented as a variety of hardware devices such as a computer, processor, Field Programmable Gate Array (FPGA), or Application Specific Integrated Circuit (ASIC).

The controller 230 may calculate an amplitude of an AC voltage using an induced voltage output from the contact portion 210 and a second voltage output from the capacitive element 220. In detail, the controller 230 may receive information about an induced voltage obtained by converting an analog signal of the induced voltage output from the contact portion 210 into a digital signal. In addition, the controller 230 may receive information about the second voltage obtained by converting an analog signal of the second voltage output through the capacitive element 220 that is connected in series to the contact portion 210 with respect to the induced voltage output from the contact portion 210 into a digital signal. Here, information about the induced voltage received by the controller 230 and information about the second voltage may be data of a digital signal obtained by sampling an AC analog signal that varies according to time or data of a signal obtained by digitizing and averaging a value formed by low-pass filtering the analog signal. That is, the controller 230 may receive a first voltage value as the amplitude of the induced voltage and a second voltage value as the amplitude of the second voltage output from a capacitive element.

The controller 230 may calculate an AC voltage applied to the wire using pre-stored capacitance of the capacitive element 220. In addition, the controller 230 may analyze the induced voltage or the second voltage to recognize a frequency of an AC signal and calculate the amplitude of the AC voltage applied to the wire using the recognized frequency. When the voltage measurement device 200 is used only to measure a voltage of a device using common AC power, the controller 230 may calculate the amplitude of the AC voltage using a pre-stored frequency of the AC power. For example, the controller 230 may use a frequency of common AC power, 60 Hz in order to calculate impedance of capacitance of the contact portion 210 and impedance of the capacitive element 220.

The aforementioned voltage measurement device may measure a voltage in a wire in a non-contact manner and may measure a voltage used by an electric device using only a simple installment without requiring powering off of the electric device to perform the installment.

Figure 3:
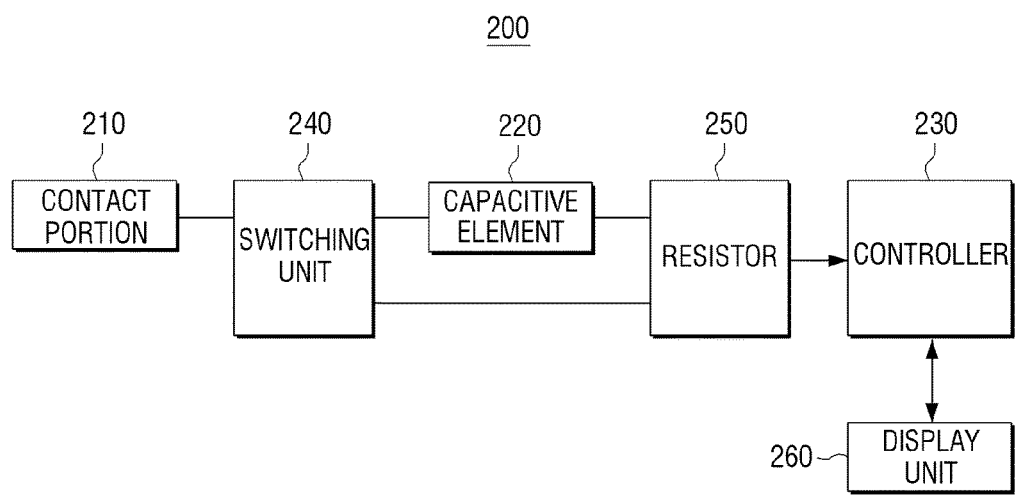
FIG. 3 is a block diagram illustrating a detailed configuration of the voltage measurement device of FIG. 2.

FIG. 3 is a block diagram illustrating a detailed configuration of the voltage measurement device 200 of FIG. 2.

Referring to FIG. 3, the voltage measurement device 200 includes the contact portion 210, the capacitive element 220, the controller 230, a switching unit 240, a resistor 250, and a display unit 260.

The contact portion 210 may directly contact a wire for transmitting an AC voltage and may output an induced voltage induced by an AC voltage on a surface of the wire. A configuration and function of the contact portion 210 are the same as the contact portion 210 of FIG. 2, and thus a detailed description thereof will be omitted.

The capacitive element 220 is connected in series to the contact portion 210. The capacitive element 220 may be an electric device having known capacitance. A configuration and function of the capacitive element 220 are the same as the configuration and function of the capacitive element 220 of FIG. 2, and thus a detailed description thereof will be omitted.

The switching unit 240 connects or disconnects the contact portion 210 to or from the capacitive element 220. In detail, the switching unit 240 may connect the contact portion 210 and the capacitive element 220 in series to each other so as to transmit a signal of an induced voltage output from the contact portion 210 to the capacitive element 220 or disconnects the contact portion 210 and the capacitive element 220 from each other so as to transmit the signal of the induced voltage to the controller 230 through the capacitive element 220, according to control of the controller 230.

The resistor 250 receives the induced voltage output from the contact portion 210 or the second voltage output from the capacitive element 220. In detail, the resistor 250 may be a resistive element having known resistance value which is connected to the contact portion 210 or the capacitive element 220 so as to be applied by the induced voltage output from the contact portion 210 or the second voltage output from the capacitive element 220 in order to generate output voltages as information about the induced voltage and the second voltage to be transmitted to the controller 230.

The display unit 260 displays the calculation result of the controller 230. In detail, the display unit 260 may display various information items in addition to the amplitude of the AC voltage calculated from the controller 230, to the user.

The controller 230 controls each component of the voltage measurement device 200. An operation and function of the controller 230 for controlling the contact portion 210 and the capacitive element 220 are the same as those of the controller 230 of FIG. 2, and thus a detailed description thereof will be omitted.

The controller 230 controls the switching unit 240 to control connection between the contact portion 210 and the capacitive element 220. In detail, the controller 230 may control the switching unit 240 so as to connect the contact portion 210 to the capacitive element 220 to receive information about the second voltage output from the capacitive element 220 and control the switching unit 240 to disconnect the contact portion 210 from the capacitive element 220 to receive the induced voltage output from the contact portion 210. In more detail, the controller 230 may control the switching unit 240 to selectively connect the contact portion 210 to the resistor 250 directly or through the capacitive element 220 according to target information. Here, sequentially, the controller 230 may control the switching unit 240 to be connected in a first connection state to acquire information about the second voltage output from the capacitive element 220 and to control the switching unit 240 to be connected in a second connection state to acquire the induced voltage output from the contact portion 210. In addition, in an opposite order, the controller 230 may control the switching unit 240 to acquire the information about the induced voltage and the information about the second voltage.

The voltage measurement device may measure a voltage in a wire in a non-contact manner and may measure a voltage used by an electric device using only a simple installment without powering off the installment.

Figure 4:
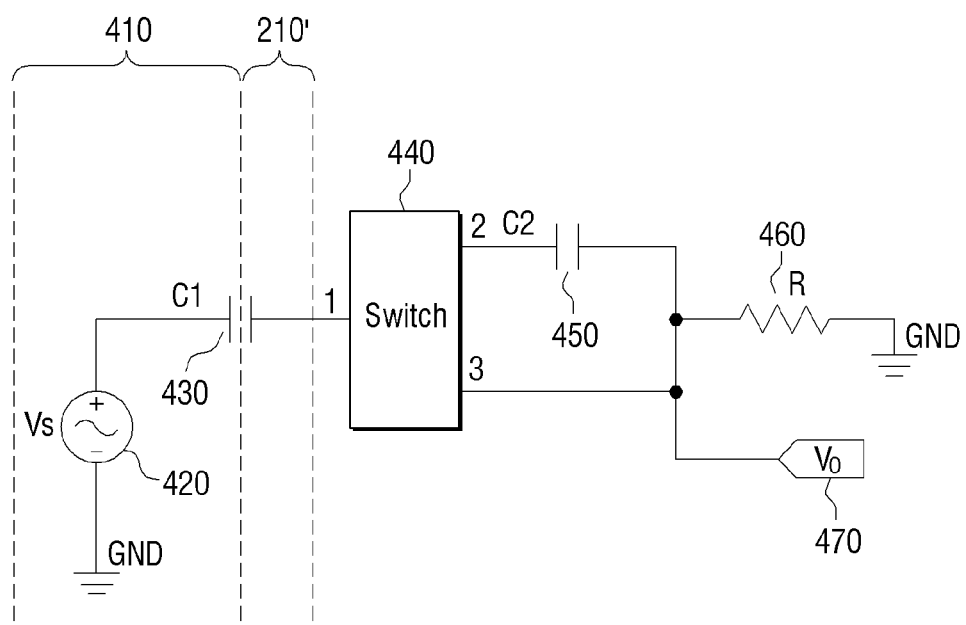
FIG. 4 is a circuit diagram of a voltage measurement device according to an embodiment of the present disclosure.

FIG. 4 is a circuit diagram of a voltage measurement device 400 according to an embodiment of the present disclosure.

Referring to FIG. 4, a circuit for measuring a voltage of an electric wire 410 for transmitting an AC voltage Vs 420 includes a contact portion 210' that contacts the electric wire 410, a switching unit 440, a capacitive element C2 450, a resistor R 460, and an output terminal Vo 470.

The AC voltage Vs 420 is applied to the electric wire 410 along a conductive wire, and a capacitance C1 430, generated by capacitive coupling, is present between the conductive wire and the contact portion 210' that contacts a surface of the electric wire 410 across a sheath as a dielectric substance.

The contact portion 210 is connected to a first pin of the switching unit 440 and transmits an induced voltage induced in the contact portion 210 by the AC voltage Vs 420 of the conductive wire to the switching unit 440.

The switching unit 440 selectively connects the first pin to a second pin or a third pin according to control of a controller (not shown).

In addition, one end of the capacitive element C2 450 is connected to the second pin of the switching unit 440 and one end of the resistor R 460 and the output terminal Vo 470 are connected to the third pin. That is, according to an operation for selectively connecting the first pin to the second pin or the third pin by the switching unit 440, the contact portion 210 may be connected to the capacitive element C2 450 or connected to the output terminal Vo 470 and the resistor R 460.

A configuration of a circuit for selective connection according to a switching state of the switching unit 440 will be described with reference to FIGS. 5 and 6.

Figure 5:
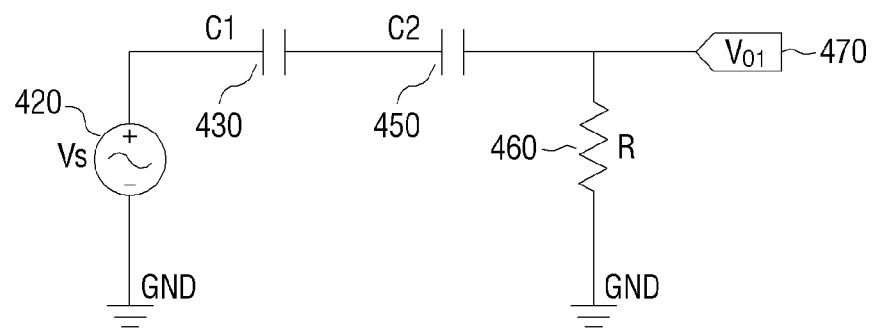
FIG. 5 is an equivalent circuit diagram of the voltage measurement device of FIG. 4 in a first switch state.

FIG. 5 is an equivalent circuit diagram of the voltage measurement device 400 of FIG. 4 in a first switch state.

Referring to FIG. 5, as the switching unit 440 of FIG. 4 connects the first pin to the second pin in a first switch state, the capacitance C1 430 formed between the conductive wire of the electric wire 410 and the contact portion 210' is connected in series to the capacitive element C2 450.

In addition, an induced voltage induced in the contact portion 210' is applied to the resistor R 460 through the capacitive element C2 450 so as to output a first voltage Vo1 to the output terminal 470. Here, the output voltage Vo1 may be induced according to the following equation for calculating a ratio for distributing the AC voltage Vs 420 to the resistor R 460 among the two capacitors C1 430 and C2 450 and the resistor R 460 which are connected in series between the voltage Vs and a ground, as set forth below in Equation 1.

$$V_{o1} = V_s \times \frac{R}{\frac{1}{j\omega C_3} + R} \quad (1)$$

Here, Vs is amplitude (Volt) of the AC voltage Vs 420 transmitted through a conductive wire of an electric wire, ω is an angular frequency (rad/s) of the AC voltage Vs, C3 is total capacitance of the capacitors C1 430 and C2 450 that are connected in series to each other and is calculated according to 1/C3=1/C1+1/C2, 1/(jωC3) is reactance (Ω) of C3, and R is resistance (Ω) of the resistor R 460.

Figure 6:
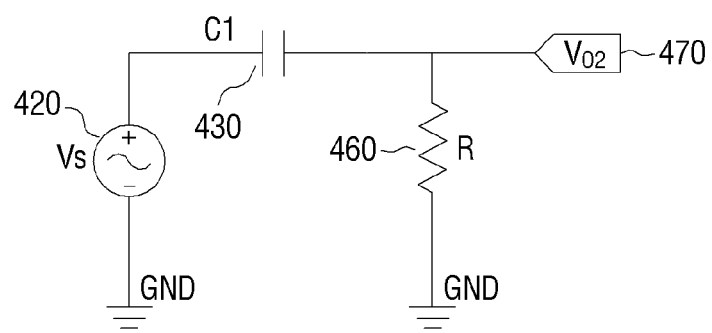
FIG. 6 is an equivalent circuit diagram of the voltage measurement device of FIG. 4 in a second switch state.

FIG. 6 is an equivalent circuit diagram of the voltage measurement device 400 of FIG. 4 in a second switch state.

Referring to FIG. 6, as the switching unit 440 of FIG. 4 connects the first pin to the third pin in a second switch state, the capacitance C1 430 formed between the conductive wire of the electric wire 410 and the contact portion 210 is connected to the resistor R 460 and the output terminal 470.

In addition, an induced voltage in the contact portion 210 is applied directly to the resistor R 460 so as to output a second voltage Vo2 to the output terminal 470. Here, the output voltage Vo2 may be induced according to the following equation for calculating a ratio for distributing the AC voltage Vs 420 to the resistor R 460 among the capacitor C1 and the resistor R 460 which are connected in series between the voltage Vs and a ground, as set forth below in Equation 2.

$$V_{o2} = V_s \times \frac{R}{\frac{1}{j\omega C_1} + R} \quad (2)$$

Here, Vs is amplitude (Volt) of the AC voltage Vs 420 transmitted through a conductive wire of an electric wire, ω is an angular frequency (rad/s) of the AC voltage Vs, C1 is capacitance of the capacitive coupled contact portion 210, 1/(jωC1) is reactance (Ω) of C1, and R is resistance (Ω) of the resistor R 460.

As described above, a configuration of a circuit connected to the contact portion 210 may be varied according to switching of the switching unit 440, and thus two different output voltages Vo1 and Vo2 and two equations for calculating two output voltages Vo1 and Vo2 may be obtained. In addition, since capacitance of the capacitive element C2 450 and resistance of the resistor 460 are already known, the AC voltage Vs and the capacitance C1 may be calculated according to a simultaneous equation of Equations 1 and 2 using the AC voltage Vs and the capacitance C1 430 capacitive-coupled between the contact portion 210 and the electric wire as unknown values.

Figure 7:
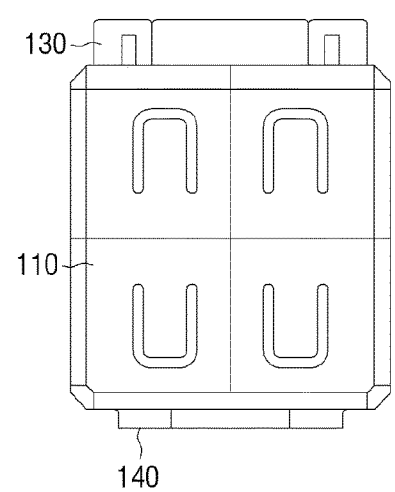
FIG. 7 is an upper side view, a rear side view, and a lateral side surface of a voltage sensor according to an embodiment of the present disclosure.
Figure 7:
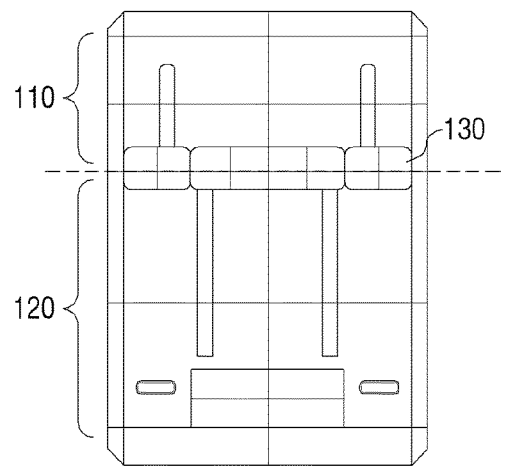
Figure 7:
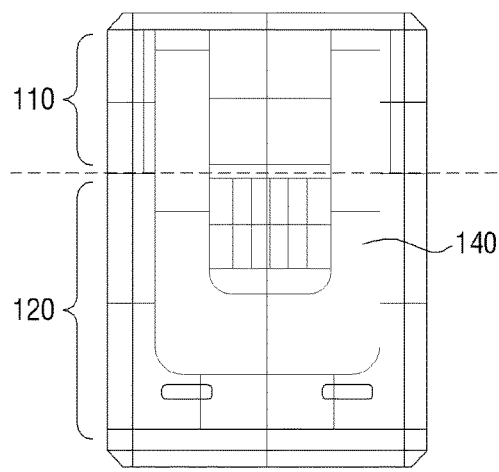
Figure 7:
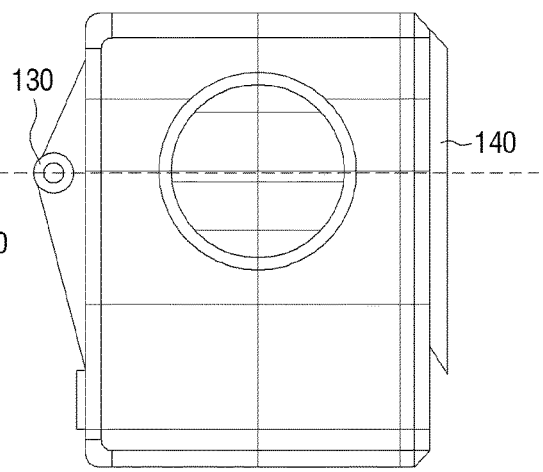

FIG. 7 is an upper side view, a rear side view, and a lateral side surface of the voltage sensor 100 according to an embodiment of the present disclosure.

The voltage sensor 100 may have a cubic structure as an overall shape and may be divided into a first body 110 and a second body 120 that are connected to each other by a hinge, for example. Here, the shape of the voltage sensor 100 is not limited to the cube of FIG. 7 and may be various shapes such as a circular cylinder and a toroid so as to contact a surface of an electric wire. In addition, the number of bodies for surrounding the electric wire is not limited to two of FIG. 7 and may alternatively be one or three.

The voltage sensor 100 may be divided into the first body 110 as an upper portion and the second body 120 as a lower portion. In addition, the first body 110 and the second body 120 of the voltage sensor 100 are hinged to each other so as to be coupled to contact each other or to be separated from each other (such as in opening voltage sensor 100) at an opposite side of the hinged portion.

An electric wire may be positioned between the two hinged bodies 110 and 120. In addition, when the first and second bodies 110 and 120 are opened, an electric wire may be positioned between the first and second bodies 110 and 120 to couple the first and second bodies 110 and 120. To this end, holes with the electric wire passed therethrough may be formed on facing surfaces of a hard outer case that protects an inner part of the voltage sensor 100 and forms an outer appearance.

A hinge member 130 may be included in a case of the voltage sensor 100 for hinge coupling of the first and second bodies 110 and 120. The hinge member 130 is not limited to the structure in which a portion of the first body 110 and a portion of the second body 120 are assembled to rotate around an axis as illustrated in FIG. 7, and the hinge member 130 may be formed of a flexible member with durability to connect the portions of the first and second bodies 110 and 120.

A locking member 140 may maintain coupling between the first body 110 and the second body 120. In detail, the locking member 140 is positioned at an opposite lateral surface of the hinged portion of the first and second bodies 110 and 120, and when an electric wire is positioned between the first body 110 and the second body 120 so as to couple the first body 110 and the second body 120, the coupling may be maintained so as not to separate the first body 110 and the second body 120 from each other due to elasticity.

Figure 8:
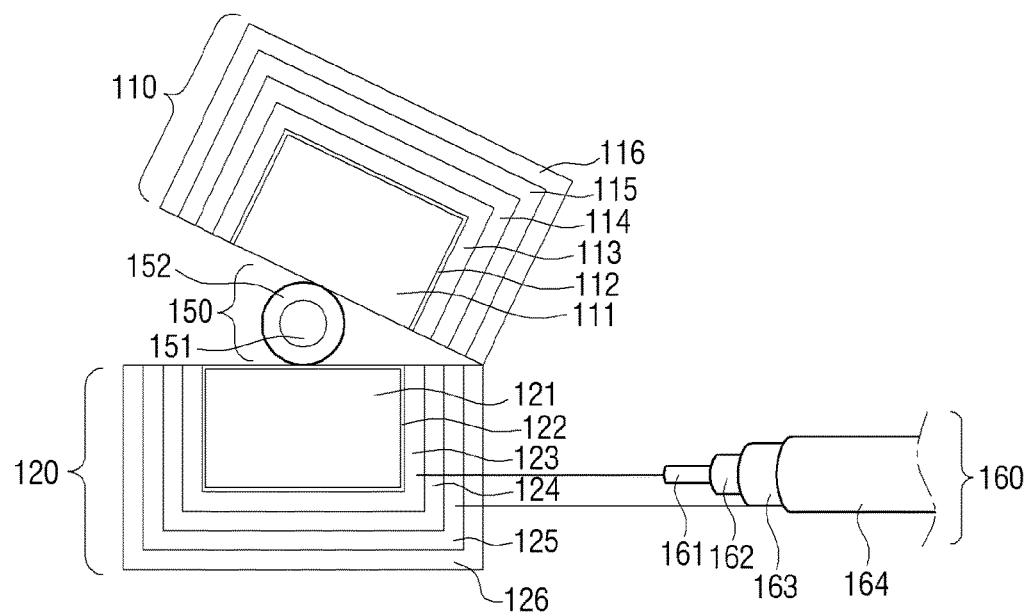
FIG. 8 is a lateral cross-sectional view illustrating a method of using a voltage sensor of FIG. 7.
Figure 8:
Figure 8:
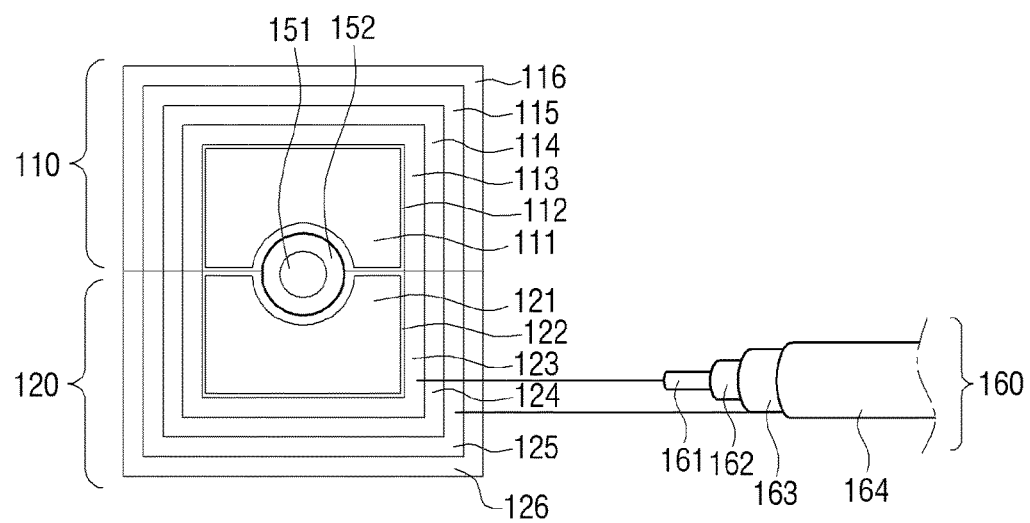

FIG. 8 is a lateral cross-sectional view illustrating a method of using a voltage sensor of FIG. 7.

Referring to FIG. 8, (a) is a cross-sectional view of a case in which an electric wire 150 is disposed in an opened gap between the hinged first and second bodies 110 and 120. In addition, (b) is a cross-sectional view of a case in which the first and second bodies 110 and 120 are coupled when the electric wire is disposed in the opened gap.

The first body 110 and the second body 120 include shape variable members 111 and 121, voltage induction members 112 and 122, signal transfer members 113 and 123, insulators 114 and 124, shield members 115 and 125, and cases 116 and 126, respectively.

As illustrated in FIG. 8(*b*), a member of a surface at which the first body 110 and the second body 120 contact the electric wire 150 is electrically deformed so as to closely contact an external surface of the electric wire 150 while the first and second bodies 110 and 120 are coupled to each other.

In addition, when the coupled first body 110 and second body 120 are opened and the electric wire 150 is removed, portions of the first body 110 and the second body 120 that have been deformed to closely contact the external surface of the electric wire 150 may be restored to their original form.

The first body 110 and the second body 120 may include the shape variable members 111 and 121 having elasticity, respectively in order to closely contact the electric wire 150. For example, the shape variable members 111 and 121 may use a material with high volume variability and good restoring force, such as sponge or urethane.

The voltage sensor 100 is capacitively-coupled to the electric wire 150. In addition, in order to increase inductive coupling of the capacitive coupling, a conductive substance with high conductivity may be used as a member for generating a conductive wire and capacitance and disposed as closely contact a conductive wire at a central portion of the electric wire 150 as possible.

According to the property of the conductive substance, the conductive substance has very low elasticity, is resistant to being deformed, and has low restoring force, and thus the voltage induction members 112 and 122 formed of thin metallic fabric may surround the shape variable members 111 and 121 with high elasticity so as to have the capacity to be deformed and restored.

The signal transfer members 113 and 123 are connected to the voltage induction members 112 and 122 so as to externally transmit signals. In detail, the signal transfer members 113 and 123 may receive an induced voltage induced by an AC voltage from the capacitive coupled voltage induction members 112 and 122 and may externally output the induced voltage. The signal transfer members 113 and 123 may be formed of a conductive substance, and when the first and second bodies 110 and 120 are coupled so as to receive the induced voltage to both the voltage induction member 112 of the first body 110 and the voltage induction member 122 of the second body 120, the signal transfer members 113 and 123 of the first and second bodies 110 and 120 are connected to each other so as to surround the voltage induction members 112 and 122 that closely contact the electric wire.

The shield members 115 and 125 shield electromagnetic waves input from an outside of the voltage sensor 100. In detail, the shield members 115 and 125 may prevent noise from being generated in an AC voltage detection signal due to external electromagnetic waves. To this end, the shield members 115 and 125 may have a shield type structure for surrounding the signal transfer members 113 and 123 while being coupled to each other.

In addition, in order to prevent signals of the signal transfer members 113 and 123 from escaping to the shield members 115 and 125, the insulators 114 and 124 may be disposed between the shield members 115 and 125 and the signal transfer members 113 and 123.

The cases 116 and 126 protect inner member from external shock and form an outer appearance.

Here, in order to externally output a signal due to an induced voltage, a coaxial cable 160 may be used. The coaxial cable 160 may include an internal conductive substance 161 for transmitting signals, an external conductive substance 163 connected to a ground, an insulator 163 disposed between the internal conductive substance 161 and the external conductive substance 163, and a sheath 164.

The internal conductive substance 161 may be connected to the signal transfer members 113 and 123, and the external conductive substance 163 may be connected to the shield members 115 and 125.

The coaxial cable 160 for outputting a signal detected by the voltage sensor 100 may be connected to the switching unit 440 of FIG. 4.

Although FIG. 8 illustrates a structure in which the insulators 114 and 124 of the voltage sensor 100 and the cases 116 and 126 are separately configured, in some embodiments, the insulators 114 and 124 and the cases 116 and 126 may be formed of a material with high durability and insulation, such as ABS resin using a plastic injection molding method so as to be manufactured as one structure.

Figure 9:
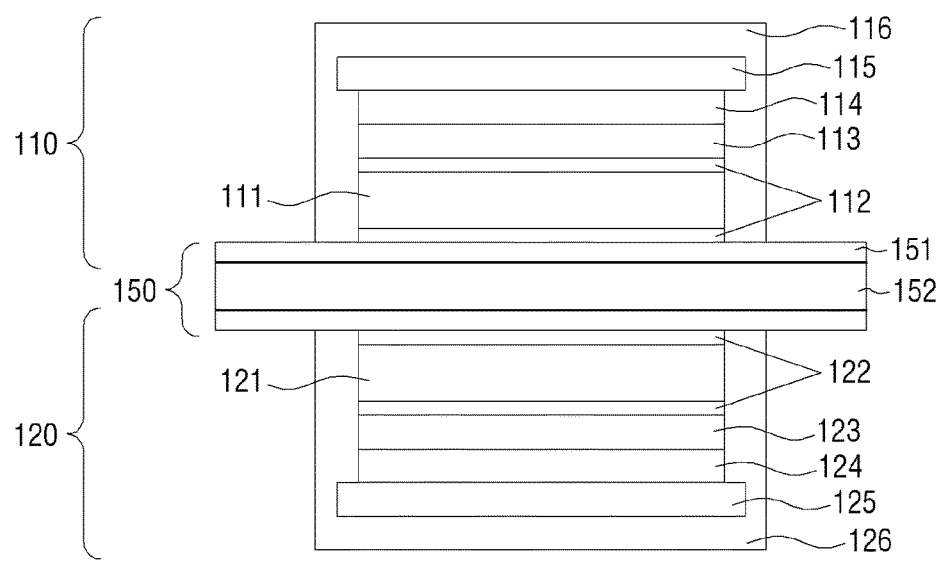
FIG. 9 is a front cross-sectional view illustrating a state in which a voltage sensor of FIG. 7 is used.

FIG. 9 is a front cross-sectional view illustrating a state in which a voltage sensor of FIG. 7 is used.

Referring to FIG. 9, the electric wire 150 is disposed through the first body 110 and the second body 120, and an electric wire 152 and the voltage induction members 112 and 122 are capacitively-coupled to each other across a sheath 151.

When the electric wire 152 transmits an AC voltage, an induced voltage is induced in the voltage induction members 112 and 122 and transmitted to the signal transfer members 113 and 123.

In addition, the insulators 114 and 124 and the shield members 115 and 125 are stacked on an external layer of the signal transfer members 113 and 123 and protect inner parts of the signal transfer members 113 and 123.

The aforementioned voltage sensor 100 may closely contact an outer circumferential surface of an electric wire so as to output an effective and high induced voltage.

The foregoing exemplary embodiments and advantages are merely exemplary and are not to be construed as limiting the present disclosure. Also, the description of the exemplary embodiments of the present disclosure is intended to be illustrative, and not to limit the scope of the claims, and many alternatives, modifications, and variations will be apparent to those skilled in the art.

What is claimed is:

1. A voltage measurement device comprising:
   a contact portion configured to contact an electrical wire for transmitting an alternating current (AC) voltage and to output an induced voltage induced by the AC voltage in a surface of the electrical wire;
   a capacitive element connected to the contact portion;
   a processor configured to calculate an amplitude of the transmitted AC voltage using the induced voltage output from the contact portion and a second voltage output from the capacitive element; and
   a first body and a second body couplable to the first body, each of the first body and the second body including a signal transfer member configured to externally transmit the induced voltage output from the contact portion.

2. The voltage measurement device as claimed in claim 1, further comprising a switching unit configured to connect and disconnect the contact portion to or from the capacitive element.

3. The voltage measurement device as claimed in claim 2, wherein the processor controls the switching unit to connect the contact portion to the capacitive element so as to receive information about the second voltage and controls the switching unit to disconnect the contact portion from the capacitive element so as to receive information about the induced voltage.

4. The voltage measurement device as claimed in claim 1, wherein:
   the electrical wire comprises a sheath having an insulator with a preset thickness that surrounds a conductive wire with the AC voltage applied; and
   the contact portion has capacitance with the electrical wire.

5. The voltage measurement device as claimed in claim 4, wherein the processor calculates the amplitude of the AC voltage and the capacitance formed between the electrical wire and the contact portion using a first voltage value as amplitude of the induced voltage output from the contact portion, a second voltage value as amplitude of the second voltage output from the capacitive element, and a capacitance of the capacitive element.

6. The voltage measurement device as claimed in claim 1, further comprising a resistor configured to externally output a signal,
wherein the processor is configured to sequentially apply the induced voltage and the second voltage to the resistor.

7. The voltage measurement device as claimed in claim 1, further comprising a display unit configured to display the amplitude of the calculated AC voltage.

8. The voltage measurement device as claimed in claim 1, wherein:
the second body hingedly couplable to the first body; and
when the electrical wire is disposed between the first body and the second body and the first body and the second body are coupled together, a portion of the first body and a portion of the second body are elastically deformed so as to closely contact an outer circumferential surface of the electrical wire and to be capacitively-coupled to the electrical wire.

9. The voltage measurement device as claimed in claim 8, wherein the contact portion is configured to restore the portion of the first body and the portion of the second body deformed to closely contact the outer circumferential surface of the electrical wire to an original form when the electrical wire is removed.

10. The voltage measurement device as claimed in claim 8, wherein:
each of the first body and the second body comprises a shape variable member with elasticity, and a voltage induction member configured to surround the shape variable member; and
the voltage measurement device is configured in such a way that the electrical wire is disposed in a gap formed by facing the voltage induction member of the first body and the second body with each other when the first body and the second body are coupled to each other.

11. The voltage measurement device as claimed in claim 10, wherein:
the signal transfer members are connected to each other when the first body and the second body are coupled to each other.

12. The voltage measurement device as claimed in claim 11, wherein each of the first body and the second body further comprise:
a shield member configured to shield an electromagnetic wave input from an outside; and
an insulator configured to prevent contact between the signal transfer member and the shield member.

13. The voltage measurement device as claimed in claim 12, further comprising a coaxial cable comprising an internal conductive substance connected to at least one of the signal transfer members and an external conductive substance connected to the shield member and a ground.

14. The voltage measurement device as claimed in claim 8, wherein the contact portion further comprises a locking member configured to maintain coupling between the first body and the second body.

15. The voltage measurement device as claimed in claim 1, wherein the capacitive element is connected in series to the contact portion.

16. A voltage sensor comprising:
a first body; and
a second body hingedly couplable to the first body,
wherein, when the first body and the second body are coupled together, a portion of the first body and a portion of the second body are configured to be elastically deformed so as to closely contact an outer circumferential surface of an electrical wire and to be capacitively-coupled to the electrical wire, and to output an induced voltage induced by an alternating current (AC) voltage applied to the electric wire, and
wherein the first body including a first signal transfer member and the second body including a second signal transfer member connectable to the first signal transfer member, the first signal transfer member and the second signal transfer member, while connected, are configured to externally transmit the output induced voltage.

17. A contact portion of a voltage sensor including a first body and a second body coupled to the first body, the contact portion comprising:
a part of a surface of the first body and a part of a surface of the second body having a gap disposed therebetween, the gap being configured to receive an electrical wire through which a current is flowable,
wherein the first body and the second body each comprise:
a voltage induction member having a high conductivity, and
a shape variable member having a high elasticity and configured to make contact with an external circumference of the electrical wire,
wherein the voltage induction member is configured to surround the shape variable member to thereby capacitively-couple to the electrical wire when the shape variable member is in contact with the external circumference of the electrical wire, and
wherein the first body including a first signal transfer member and the second body including a second signal transfer member connectable to the first signal transfer member, the first signal transfer member the second signal transfer member, while connected, are configured to externally transmit a voltage induced in the voltage induction member by the capacitive coupling when the current flows through the electrical wire.

18. The contact portion as claimed in claim 17, wherein the first signal transfer member and the second signal transfer member, while connected, are configured to surround the voltage induction member.

19. The contact portion as claimed in claim 18, wherein each of the first body and the second body further comprise:
a shield member configured to shield an electromagnetic wave input from an outside wherein the shield member is configured to surround the first signal transfer member and the second signal transfer member; and
an insulator, disposed between the first signal transfer member and the second signal transfer members and the shield member, the insulator being configured to prevent contact between the first signal transfer member and the second signal transfer member and the shield member.

20. The contact portion as claimed in claim 19, wherein each of the first body and the second body further comprise:
a cover member to surround the shield member and to form an outer appearance of the first body and the second body.

* * * * *